United States Patent
Kearney et al.

[11] Patent Number: 6,107,816
[45] Date of Patent: Aug. 22, 2000

[54] TEST APPARATUS FOR TIME DEPENDENT DIELECTRIC BREAKDOWN

[75] Inventors: Joseph William Kearney, Palmer, Pa.; Daniel M. Wroge, Orlando, Fla.

[73] Assignee: Lucent Technologies Inc., Murray Hill, N.J.

[21] Appl. No.: 08/846,743

[22] Filed: Apr. 30, 1997

[51] Int. Cl.[7] .................................................. G01R 31/26
[52] U.S. Cl. .................................................. 324/765
[58] Field of Search .................................. 324/754, 755, 324/761, 762, 158.1, 73.1, 719, 766, 765, 769, 693, 699; 257/40, 48; 438/14, 18, 17

[56] References Cited

U.S. PATENT DOCUMENTS

| | | | |
|---|---|---|---|
| 4,038,599 | 7/1977 | Bove et al. | 324/754 |
| 4,476,433 | 10/1984 | Logan | 324/761 |
| 5,023,561 | 6/1991 | Hillard | 324/719 |
| 5,066,907 | 11/1991 | Tarzwell et al. | 324/756 |
| 5,126,662 | 6/1992 | Jinbo | 324/766 |
| 5,239,270 | 8/1993 | Desbiens | 324/719 |
| 5,808,475 | 9/1998 | Knauer et al. | 324/754 |

*Primary Examiner*—Vinh P. Nguyen

[57] ABSTRACT

A test structure and test fixture which are capable of measuring time dependent dielectric breakdown under accelerated temperature test conditions which can extend to 300° C. The test structure is a parallel plate configuration with metal electrodes which is insensitive to polarity. The test fixture employs a ceramic or polymide body which remains rigid and well isolated electrically under these test conditions

21 Claims, 4 Drawing Sheets

TEST APPARATUS FOR TIME DEPENDENT DIELECTRIC BREAKDOWN

BACKGROUND OF THE INVENTION

1. Field of the Invention

This invention relates to the time dependent electrical breakdown of dielectric layers, and in particular to those layers used as insulators in the semiconductor industry where accelerated testing is desirable to reduce qualification time.

2. Description of Related Art

Advances in the art of semiconductor processing have dramatically increased the number of functional elements on a semiconductor chip. This has been accomplished by increasing the size of the chip somewhat, but more importantly, by reducing the size of the minimum feature (the design rule) on the chip. A one micron design rule was common for a 1 MB DRAM design, and a 0.18 micron design rule is being considered for a 1 GB DRAM. The dielectric layers separating these features is also being scaled down in thickness, making the qualification of these layers and the prediction of their lifetime reliability ever more important.

Improvements in processing have also made dielectric layers lifetimes increase, which increases the time and sample size needed to qualify a new process. Further, increased competition in the semiconductor industry has reduced design cycle times to a few months. Accelerated stress testing is used to reduce the time to observe failures, and temperature is one factor which is used in accelerated testing to get a specific fraction of the test population to fail.

Many chemical and physical processes leading to failure are accelerated by temperature in a way that can be readily modeled and reproduced. The relation between reaction rates and temperature is expressed by the well known Arrhenius relationship $$R = R_o \exp[-E_a/kT]$$

where
R=Reaction Rate
Ro=a constant
Ea=activation energy, in electron volts
K=Boltzman's constant, 8.6(10)–5 eV/deg.K
T=absolute temperature, deg. K.

This can be conveniently expressed in graphical form by plotting reciprocal temperature versus log time for a constant fraction of failure. If the Arrhenious relationship holds, the plot is linear and the slope is related to $k/E_a$.

Reducing testing time therefore requires higher test temperature, which in turn places a burden on test fixtures and which can cause spurious effects within the device under test. For example, present testing is done at a temperature of 174 degrees Centigrade for four weeks using test probes which are gold plated, mounted in acrylic and utilize point to point wiring. These materials fail at temperatures like 300 degrees Centigrade which would significantly reduce test times. The gold interdiffuses with aluminum test pads to form a brittle intermetallic compound, and polymer substrates simply melt, prior to charring. Attempts have been made to water cool the test fixture, but this is awkward and often not available in so called "dry" electrical laboratories.

Testing with metal-oxide-silicon devices produces polarity effects where the applied voltage is not completely distributed across the dielectric due to space charge effects so the tests are polarity dependent.

Accordingly, there is a need in the art for a test structure and its associated fixtures which can apply a known electrical field across a dielectric layer at temperatures around 300 degrees Centigrade.

SUMMARY OF THE INVENTION

The present invention relates to a test structure and a test fixture which are adapted to accelerate time dependent dielectric breakdown testing by raising the upper limit of testing to about 300° C. This will reduce the time required to generate meaningful statistics and cause more failures at any given time to improve the confidence of statistical analysis. The parallel plate test structure ensures that the full applied potential exists across the dielectric regardless of polarity because each electrode of the test structure is a metal. This is not possible with semiconductor electrodes.

In one embodiment of the invention, a semiconductor substrate supports a metallic base electrode upon which a dielectric layer is deposited. An aperture in the dielectric layer and subsequent metallization exposes the base electrode for probing. A top electrode is deposited over the dielectric layer to form a parallel plate capacitor where the electrodes overlap. A cover layer may be applied over the test structure to prevent mechanical damage. The electrodes, the dielectric layer, and the cover layer are etched to form their required configurations by standard semiconductor processing techniques.

In another embodiment of the invention, a test fixture for measuring time dependent dielectric breakdown in the structure described above is comprised of an inorganic body having a series of hole pairs which match the spacing of exposed portions of a base electrode and its corresponding top electrode. A spring loaded contact is inserted in each hole. Conductors plated into each hole and on the surface of the body carry a test potential from connector contacts at the edge of the body.

In a preferred embodiment, the body is made of alumina and the contact pins are stainless steel which is rhodium plated. The electrodes on the test structure are typically aluminum, but they can be any metal or refractory metal silicide combination that is interesting to test.

The embodiments provide features and advantages of the invention which will be better understood with consideration of the following detailed description of the preferred embodiments taken in conjunction with the accompanying drawings.

The drawings are not to scale.

DETAILED DESCRIPTION OF THE PREFERRED EMBODIMENTS

Figure 1:
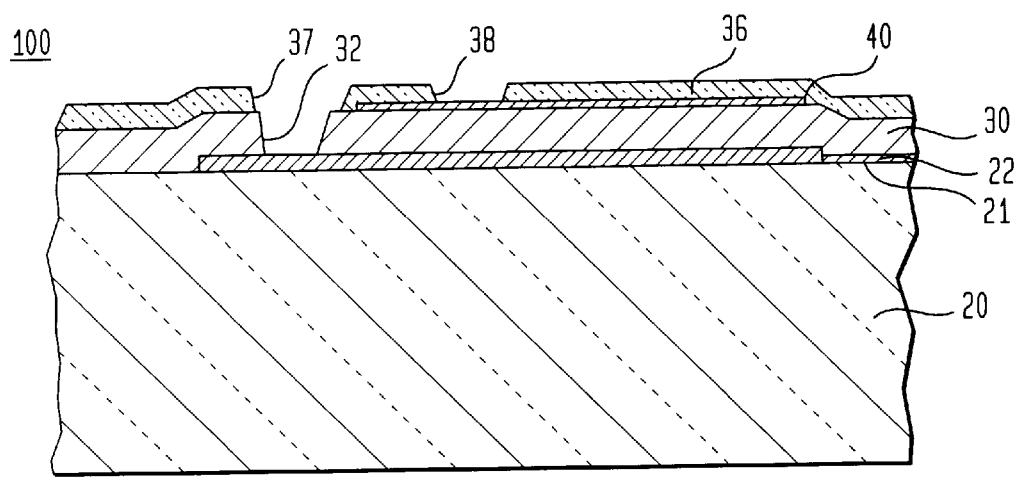
FIG. 1, is a sectional view of one embodiment of the invention.

Referring now to FIG. 1, there is shown test structure 100, in accordance with one embodiment of the invention, wherein semiconductor substrate 20 having an upper surface 21 upon which is deposited base electrode 22. Dielectric layer 30 covers most of the base electrode but it also defines first aperture 32 which keeps a part of the base electrode accessible for contact by a probe. Top electrode 40 covers the dielectric layer forming a parallel plate capacitor in conjunction with the dielectric layer and the base electrode in areas where they overlap. A cover layer 36 may be applied over the capacitor structure to protect it from mechanical abrasion with a second aperture 37 coinciding with first aperture 32 to provide access to the base electrode, and third aperture 38 providing access for a probe to the top electrode.

The substrate may be n-type or p-type and may be made of silicon or any III–IV semiconductor compound. The base electrode may be any refractory metal silicide used in semiconductor processing to withstand high temperature processing such as, but not limited to, titanium silicide or tungsten silicide. It may also be a metal such as aluminum. A multiplicity of base electrodes are etched on the substrate to replicate test structure 100 over a substrate which may be as large as eight inches in diameter. The dielectric layer is usually an oxide or a nitride, and most commonly is silicon dioxide which is deposited by chemical vapor deposition and etched with well known methods to provide apertures. The top electrode is usually etched aluminum as it is in making commercial chips. The cover layer is an insulator patterned with apertures to provide access to the two electrodes, and for high temperature testing it is preferably silicon oxide. Typical thicknesses of the layers range from 500 to 5000 angstroms for the electrodes, 40 to 4000 angstroms for the dielectric layer, and 1000 to 10,000 angstroms for the cover layer.

Figure 2:
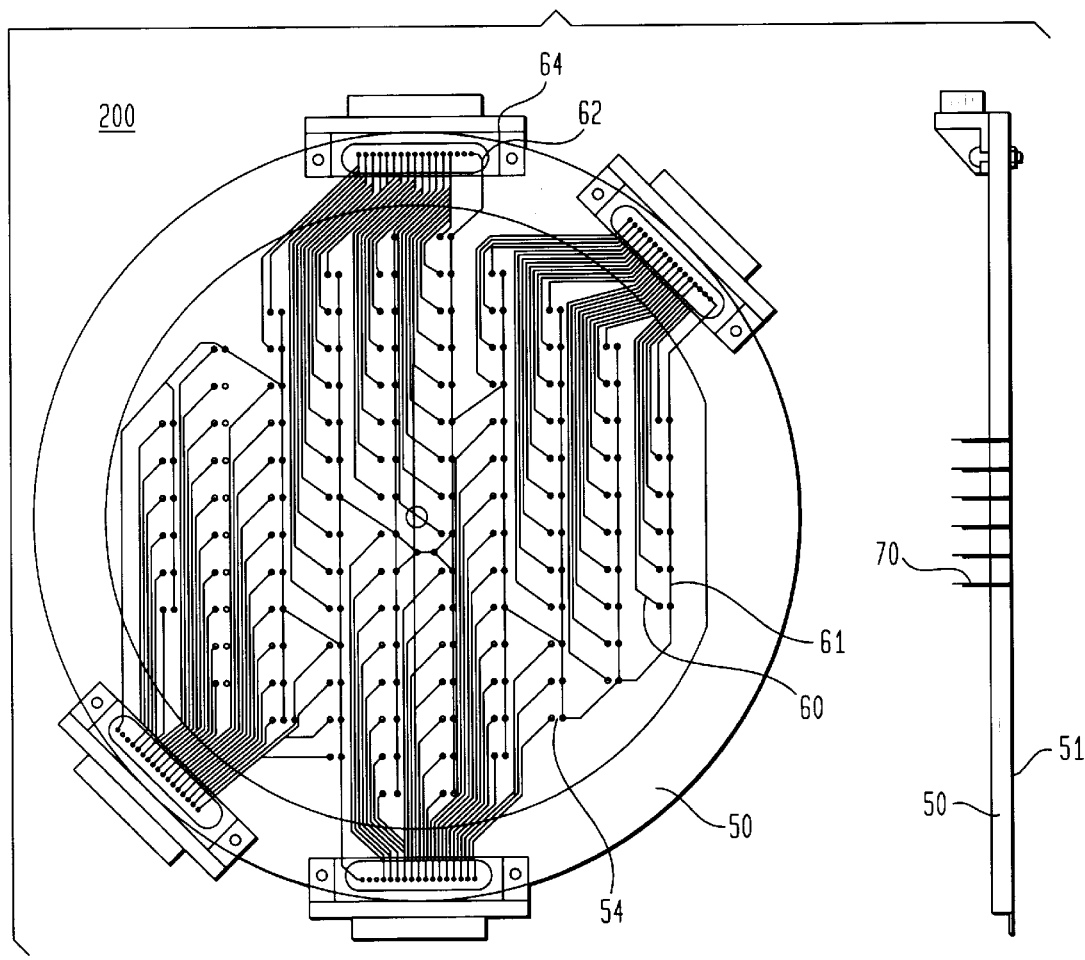
FIG. 2 is provides a top and side view of another embodiment of the invention.

Referring now to FIG. 2, there is shown test fixture 200 for measuring time dependent dielectric breakdown at elevated temperatures. These temperatures exceed the operating temperatures of organic printed wiring board materials or plastic fixuring materials because the body 50 is made of an inorganic material, preferably a ceramic, and most preferably one whose primary ingredient is aluminum oxide whose concentration exceeds 50% by weight. This change in materials greatly extends the temperature range from 174° C. which is a present maximum using acrylic over a four week interval to at least 300° C. The higher test temperature will significantly reduce the interval required at the lower temperature and it also will generate a greater proportion of failures which also increases the certainty of the test data.

The body defines a series of hole pairs 54 which are conveniently formed by laser drilling, where the spacing between each hole of the pair matches the distance between exposed portions of the base and top electrodes of test structure 100. Similarly, the pitch between adjacent holes in horizontal and vertical directions matches that of the repetitive test structures of FIG. 1. Each hole supports plated metallization on its interior surface, and the same metallization also covers at least one surface 51 of the body. The metallization is etched to form conductors 60 and 61 from each hole pair to connector contacts 62 at the edge of the test fixture. The metallization is preferably copper which is 2.1 mils thick and covered with a finish of rhodium or any noble metal to protect the copper from oxidation at temperatures of about 300° C. Commercial connectors 64 have contacts which align with contacts 62 on the body to supply a bias potential across each hole in a pair. To simplify wiring, a conductor 61 may be common to one hole in each pair and a second 60 may be unique to one hole in each pair through which bias is applied and failures are sensed by an external test set (not shown). A spring loaded contact 70, comprising a socket, an interior spring, and a movable contact which is biased by the spring to move along a common axis the spring has with the socket is press fit into each metallized hole. The movable contacts are arranged to meet exposed areas of the electrodes of test structure 100.

In a preferred embodiment, the spring loaded contact (commonly referred to as a Pogo pin) is supplied by Augat, Mansfield, Mass., as part number P2662HR 1R35. They are made of stainless steel and are rhodium plated for high temperature service. The holes in the body are 36 mills in diameter and counter sunk to 41 mils in diameter for a depth of 100 mils. The body is 0.25 inches thick and 9.75 inches in diameter. The distance between centers of one hole pair is 150 mills. The vertical and horizontal pitch between hole pairs is 690 mils and 470 mils, respectively. The connectors which mount to the body are supplied by Amphenol, Wallingford, Connecticut, as part number 57LE-40360-2700.

Figure 3:
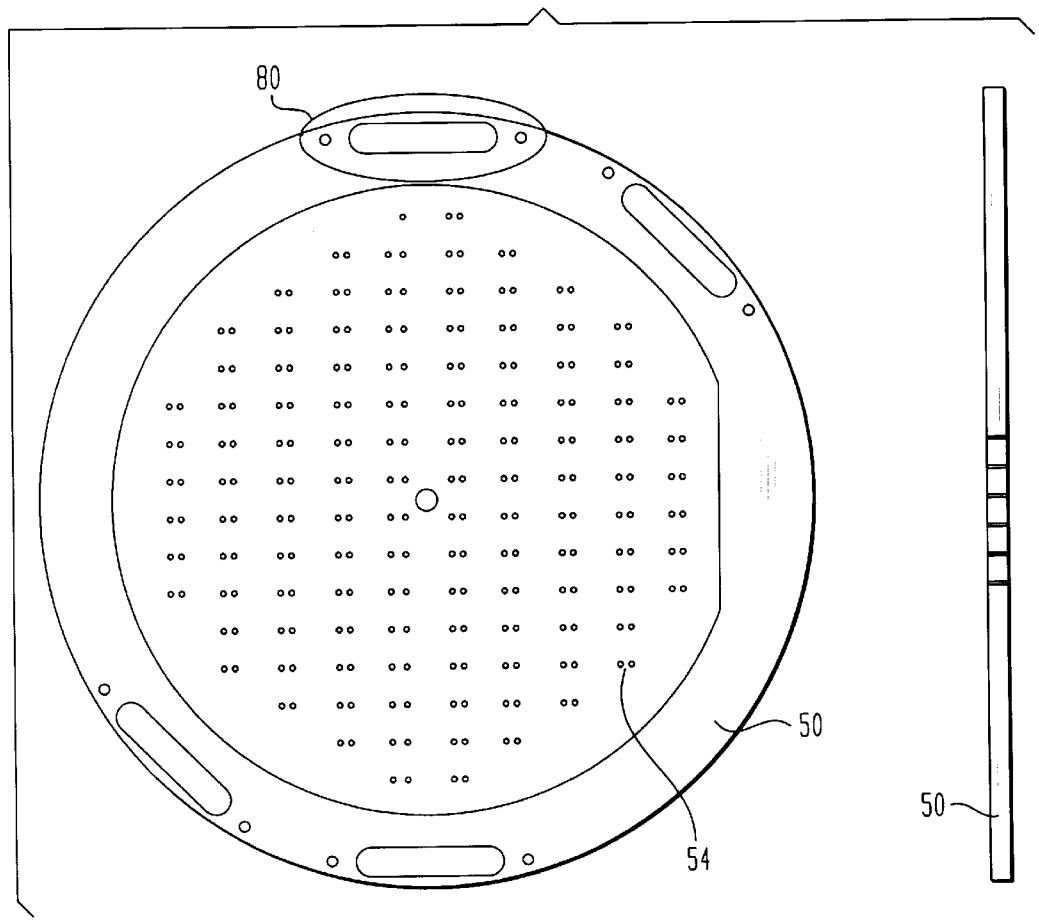
FIG. 3 is another top and side view of that embodiment.

Referring now to FIG. 3, body 50 is shown before a metallization pattern of conductors has been applied to more clearly reveal the multiplicity of hole pairs 54 and cut-out configuration 80 which is adapted to mount the external connectors.

Figure 4:
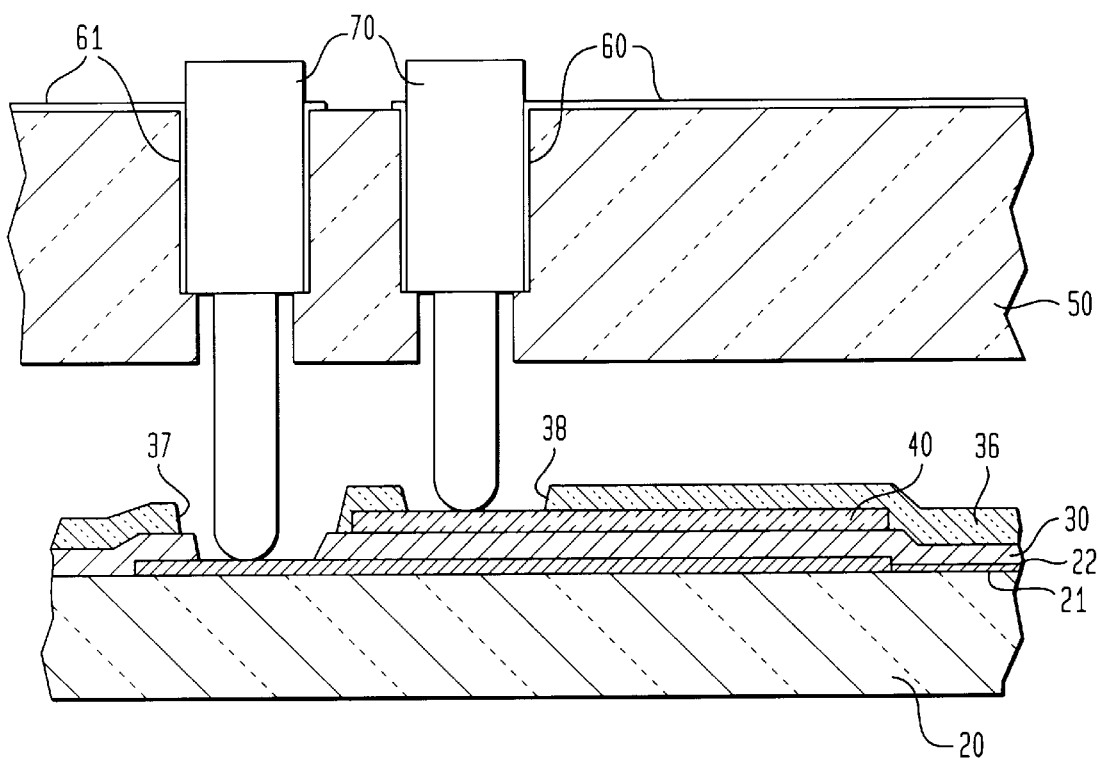
FIG. 4 shows these embodiments in cooperation with each other.

Referring now to FIG. 4, there is shown test structure 100 and test fixture 200 operating in conjunction with each other. The elements have the same numbers and perform the same functions as described in FIGS. 1 and 2. An electric field is applied across dielectric layer 30 by base electrode 22 and top electrode 40, each of which is contacted by a spring loaded contact 70. Conductors 60 and 61 are plated into each hole of the pair restraining the spring loaded contacts. The conductors go to the edge of body 50 where they are ultimately connected to a test set.

The advantages of the combination of test structure 100 shown in FIG. 1 and test fixture 200 shown in FIG. 2 are the ability to extend accelerated stress testing for dielectric breakdown to temperatures of about 300° C., which is beyond the range of conventional organic and polymeric based test fixtures. This elevated temperature range reduces test cycle time, hence design or lot qualification assurance time, in a very competitive environment. With the continuing perfection with which dielectrics such as silicon dioxide can be deposited, the fraction failed at any test temperature has been reduced, which makes the failure statistics and lifetime reliability prediction less reliable. Accelerating the temperature stress to 300° C. will increase the failure rate and help generate more confidence in reliability predictions.

The parallel plate capacitor structure of FIG. 1 also avoids space charge effects found in metal-oxide-silicon devices which use the back of the silicon wafer as a common contact. These effects can reduce the electric field applied across the dielectric. With test structure 100 the applied potential is entirely across the dielectric layer regardless of polarity.

Changes and modifications in the specifically described embodiments can be carried out without departing from the scope of the invention. In particular, the metallizations on the body can be varied to include nickel or any of the noble metals and their alloys which are well known in the art of metallization. Additionally, substrate material like polymide may be utilized in place of ceramic to achieve lower cost in return for minimal performance degradation.

I claim:

1. An integrated metal-oxide-silicon device for testing time dependent dielectric breakdown at high temperatures comprising:

a semiconductor substrate having an upper surface;

at least one base electrode supported by the upper surface;

a dielectric layer, supported by the base electrode, said dielectric layer defining a first aperture which leaves a portion of the base electrode exposed; and at least one top electrode supported by the dielectric layer;

whereby the exposed portion of the base electrode and the top electrode are each adapted to being contacted by a spring loaded probe to create a known electric field for measuring time dependent dielectric breakdown across said dielectric layer so that said dielectric layer is tested.

2. The device of claim 1 wherein the base electrode is a refractory metal silicide.

3. The device of claim 1 wherein the base electrode is aluminum.

4. The device of claim 1 wherein the dielectric layer is aluminum.

5. The device of claim 1 wherein the top electrode is aluminum.

6. The device of claim 1 further comprising a cover layer, supported in part by the dielectric layer and supported in part by the top electrode, said cover layer defining a second aperture concentric with the first aperture thereby exposing the base electrode, and defining a third aperture adapted to expose a portion of the top electrode so the electrodes may be contacted by the spring loaded probe.

7. The device of claim 6 wherein the cover layer is silicon dioxide.

8. A test fixture for measuring time dependent dielectric breakdown of a dielectric layer of a test structure at elevated temperatures, the test fixture comprising:

an inorganic body having a base, said body defining a series of hole pairs, the spacing between each hole pair being the same as the spacing between exposed portions of a base electrode and a corresponding top electrode on the test structure, and the pitch between hole pairs being the same as the pitch between base electrodes on the test structure;

at least two spring loaded contacts, each comprising a socket, a spring, and a pin, the pin being adapted to being biased by the spring to move along a common axis with the socket, the socket of each contact being adapted to fit within a hole in the body, said spring loaded contacts operable to create a known electric field for measuring time dependent dielectric breakdown across the dielectric layer of the test structure;

at least two conductors supported by the base, each conductor covering an interior surface of a hole in the base and extending to at least one surface of the base to an edge; and at least two connector contacts, each contact being adapted to touch a conductor supported by the base and to connect through external wiring to a test circuit;

whereby the socket of each contact makes electrical contact with a conductor on the interior surface of a hole in the body.

9. The test structure of claim 8 wherein the inorganic body is a ceramic or polymide.

10. The test structure of claim 9 wherein the ceramic is comprised primarily of aluminum oxide.

11. The test structure of claim 8 wherein the contacts are comprised of stainless steel.

12. The test structure of claim 11 wherein the contacts are plated with rhodium.

13. The test structure of claim 8 wherein the conductors are copper.

14. The test structure of claim 13 wherein the conductors are plated with rhodium.

15. A test combination comprising a test fixture for measuring time dependent dielectric breakdown of a dielectric layer of a test structure at elevated temperatures, the test structure comprising:

a semiconductor substrate having an upper surface;

at least one base electrode supported by the upper surface;

a dielectric layer, supported by the base electrode, said dielectric layer defining a first aperture which leaves a portion of the base electrode exposed;

at least one top electrode, supported by the dielectric layer, at least a portion of which is located over the base electrode;

whereby the exposed portion of the base electrode and the top electrode are each adapted to being contacted by a spring loaded probe to create a known electric field for measuring time dependent dielectric breakdown across said dielectric layer, so that said dielectric layer is tested;

the test fixture comprising:

an inorganic body having a base, said body defining a series of hole pairs, the spacing between each hole pair being the same as the spacing between exposed portions of a base electrode and a corresponding top electrode on a test structure, and the pitch between hole pairs being the same as the pitch between base electrodes on the test structure;

at least two spring loaded contacts, each comprising a socket, a spring, and a pin, the pin being adapted to being biased by the spring to move along a common axis with the socket, the socket of each contact being adapted to fit within a hole in the body, said spring loaded contacts operable to create a known electric field for measuring time dependent dielectric breakdown across the dielectric layer of the test structure;

at least two conductors supported by the base, each conductor covering an interior surface of a hole in the base and extending to at least one surface of the base to an edge; and at least two conductor contacts, each contact being adapted to touch a conductor supported by the base and to connect through external wiring to a test circuit;

whereby the socket of each contact makes electrical contact with a conductor on the interior surface of a hole in the body.

16. The test combination of claim 15 further comprising:

a cover layer, supported in part by the dielectric layer and supported in part by the top electrode, said cover layer defining a second aperture concentric with the first aperture thereby exposing the base electrode, and defining a third aperture adapted to expose a portion of the top electrode so the electrodes may be contacted by a spring loaded contact.

17. The test combination of claim 15 wherein the inorganic body is comprised primarily of aluminum oxide.

18. The test combination of claim 15 wherein the contacts are comprised of stainless steel.

19. The test structure of claim 18 wherein the contacts are plated with rhodium.

20. The test structure of claim 15 wherein the conductors are copper.

21. The test structure of claim 20 wherein the conductors are plated with rhodium.

* * * * *